(12) United States Patent
Koradia et al.

(10) Patent No.: US 6,190,188 B1
(45) Date of Patent: Feb. 20, 2001

(54) CIRCUIT BOARD EJECTOR HAVING A MANUALLY OPERABLE PORTION

(75) Inventors: Amir Koradia, Palatine; Philip A. Ravlin, Bartlett; Douglas J. Pogatetz, Arlington Heights, all of IL (US)

(73) Assignee: 3Com Corporation, Rollings Meadows, IL (US)

( * ) Notice: Under 35 U.S.C. 154(b), the term of this patent shall be extended for 0 days.

(21) Appl. No.: 09/258,691

(22) Filed: Feb. 26, 1999

(51) Int. Cl.[7] .................................................. H01R 13/62
(52) U.S. Cl. .............................................................. 439/160
(58) Field of Search .................................. 439/160, 157, 439/152, 155

(56) References Cited

U.S. PATENT DOCUMENTS 5,380,213 * 1/1995 Piorunneck et al. .................. 439/160
5,662,485 * 9/1997 Yip et al. ............................... 439/157

* cited by examiner

*Primary Examiner*—Neil Abrams
*Assistant Examiner*—Javaid Nasri
(74) *Attorney, Agent, or Firm*—Baniak Nicholas Pine & Gannon

(57) ABSTRACT

A circuit board ejector includes a handle portion and a hook portion, the handle portion including a manually operable portion. The manually operable portion includes a plurality of ridge portions and a raised lip portion to allow a user to apply a load to the manually operable portion to position the circuit board ejector into a locked position.

7 Claims, 1 Drawing Sheet

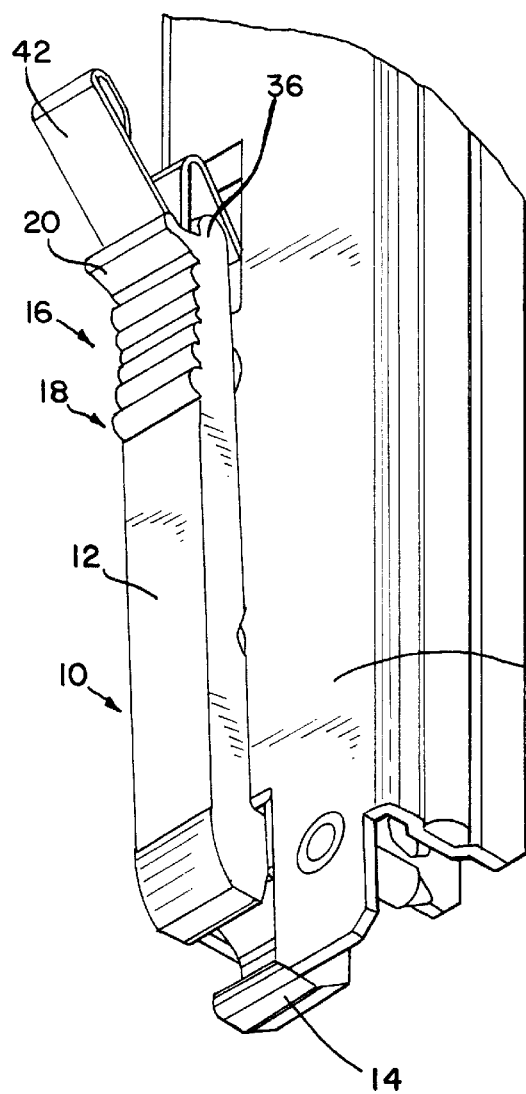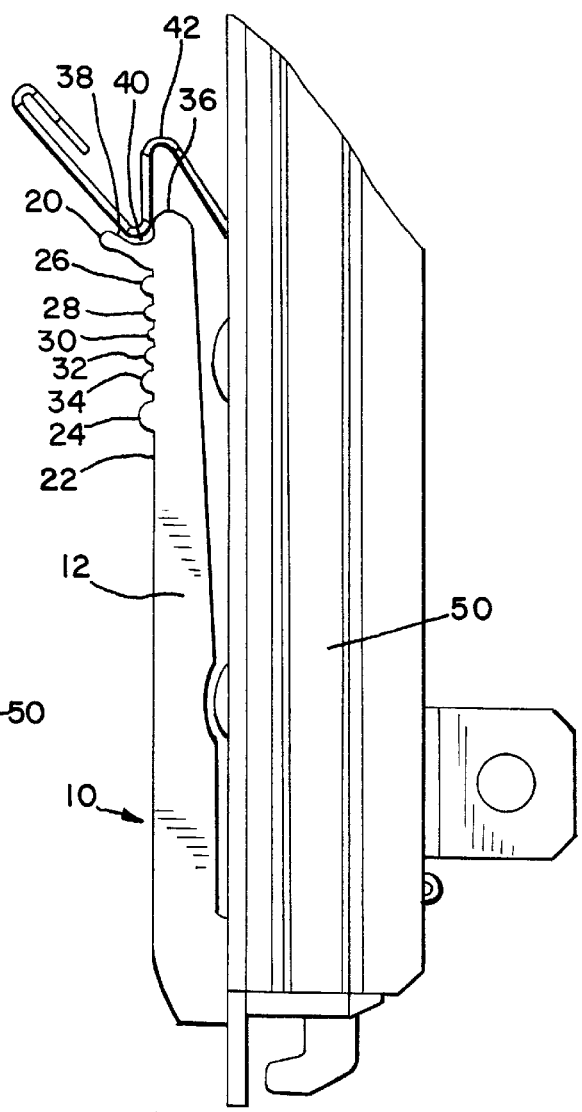

CIRCUIT BOARD EJECTOR HAVING A MANUALLY OPERABLE PORTION

FIELD OF THE INVENTION

This invention relates generally to the field of mechanical fasteners and in particular, to a circuit board ejector used for mounting a circuit board to an electronic chassis.

BACKGROUND OF THE INVENTION

An electronic chassis which houses electronic components for high speed telecommunication and networking applications typically includes a plurality of vertically oriented circuit board assemblies that are inserted into the chassis. Each circuit board assembly is typically comprised of a circuit board attached to a U-shaped channel member that serves as a front faceplate of the assembly. When the assembly is fully inserted, the circuit board is connected to a backplane printed circuit located along the backside of the chassis. The insertion force required to connect the circuit board to the backplane may make it difficult, if not impossible, for a user to make the connection by manually forcing the channel member in a direction towards the backplane.

In order to facilitate the connection of the circuit board to the backplane, attempts have been made to provide a mechanical connector at each end of the channel member, each mechanical connector having a handle portion and a hook portion. The mechanical connectors are typically rotatably attached to each end of the channel member and are able to rotate freely about a pin that is attached to the channel member. When installing the circuit board assembly, a user typically orients each hook portion to allow each hook portion to engage a flange portion of the chassis. After each hook portion engages the flange portion, the handle portion of each mechanical connector is then manually rotated about the pin, which forces the circuit board into the backplane. The handle portion typically has a generally rectangular-shape having a smooth surface along its outer surface. In order to rotate the handle portion, a user applies a load to the smooth outer surface of the handle portion. The disadvantage of this arrangement is that the smooth surface may cause the user's fingers to slip off the handle portion during actuation of the handle portion. Moreover, the handle portion typically does not have a designated area along its outer surface to provide the optimum location for the user's fingers to make contact with handle portion. As a result, a user may apply a load to the handle portion at a location that is closer to the pivot point of the mechanical connector. This in turn may result in greater loads having to be applied to the handle portion making insertion of the circuit board assembly into the chassis more difficult, if not impossible.

Accordingly, it would be desirable to have a circuit board ejector that overcomes the disadvantages described above.

SUMMARY OF THE INVENTION

One aspect of the invention provides a circuit board ejector including a handle portion and a hook portion. The handle portion includes a manually operable portion. The manually operable portion includes a plurality of ridge portions and a raised lip portion to allow a user to apply a load to the manually operable portion which is at an optimum location along the handle portion to position the circuit board ejector into a locked position. The plurality of ridge portions and the raised lip portion may preferably extend outward from an outer surface of the handle portion. The plurality of ridge portions may preferably extend outward varying distances from the outer surface of the handle portion. The plurality of ridge portions may preferably include outer ridge portions and inner ridge portions, the outer ridge portions extending outward from an outer surface of the handle portion a greater distance than the inner ridge portions. The plurality of ridge portions may preferably each have an arcuate surface. The raised lip portion may preferably be located adjacent an end of the handle portion and may preferably extend outward from the outer surface of the handle portion a greater distance than the plurality of ridge portions. An outer side of the lip portion may preferably define a recess to receive a locking spring. The handle portion may preferably be comprised of aluminum.

Another aspect of the invention provides a circuit board ejector including a handle portion and a hook portion. The handle portion includes a manually operable portion located adjacent an end of the handle portion. The manually operable portion includes a plurality of integrally formed ridge portions and an integrally formed raised lip portion to allow a user to apply a load to the manually operable portion which is at an optimum location along the handle portion to position the circuit board ejector into a locked position.

Another aspect of the invention provides a method of operating a circuit board ejector. A circuit board ejector including a handle portion and a hook portion is provided. The handle portion includes a manually operable portion. The manually operable portion includes a plurality of ridge portions and a raised lip portion. A load is applied to the manually operable portion, and the circuit board ejector is positioned into a locked position.

The invention provides the foregoing and other features, and the advantages of the invention will become further apparent from the following detailed description of the presently preferred embodiments, read in conjunction with the accompanying drawings. The detailed description and drawings are merely illustrative of the invention and do not limit the scope of the invention, which is defined by the appended claims and equivalents thereof.

BRIEF DESCRIPTION OF THE DRAWINGS

FIG. 1 is a perspective view of a preferred embodiment of a circuit board ejector in a locked position; and FIG. 2 is a side view of the embodiment shown in FIG. 1.

DETAILED DESCRIPTION OF THE PRESENTLY PREFERRED EMBODIMENTS

As shown in FIGS. 1–2, a preferred embodiment of a circuit board ejector 10 includes a handle portion 12 and a hook portion 14. The handle portion 12 includes a manually operable portion 16. The manually operable portion 16 includes a plurality of ridge portions 18 and a raised lip portion 20. The manually operable portion 16 may preferably be located adjacent an end 36 of the handle portion 12. The circuit board ejector 10 shown in FIGS. 1–2 allows a user to apply a load to the manually operable portion 16 which is at an optimum location along the handle portion 12 to position the circuit board ejector 10 into a locked position.

As shown in FIGS. 1–2, the circuit board ejector 10 is rotatably attached to a bracket member 50, which in turn is operatively attached to a circuit board (not shown). The circuit board ejector 10 facilitates the insertion of a circuit board into an electronic chassis. A preferred embodiment of a circuit board ejector and its operation is described in U.S. patent application Ser. No. 09/144,830, the entire disclosure of which is incorporated herein by reference.

Referring to FIGS. 1–2, the circuit board ejector 10 is preferably 3 inches in length and 0.312 inches in width. It may preferably be comprised of aluminum or any other suitable metallic material. Alternatively, the circuit board ejector 10 may be comprised of any other type of suitable rigid material such as, for example, plastic. The circuit board ejector 10 may preferably be comprised of a single piece of extruded material. As a result, the plurality of ridge portions 18 and the raised lip portion 20 may preferably be integrally formed with the handle portion 12. An advantage of this arrangement is the elimination of discrete components for the plurality of ridge portions 18 and the raised lip portion 20, which results in reduced manufacturing costs.

As shown in FIGS. 1–2, the plurality of ridge portions 18 and the raised lip portion 20 may preferably extend outward from an outer surface 22 of the handle portion 12. The plurality of ridge portions 18 may preferably extend outward varying distances from the outer surface 22 of the handle portion 12 to facilitate contact of an operator's finger with the manually operable portion 16 of the handle 12. As shown in FIG. 2, the plurality of ridge portions 18 includes outer ridge portions 24, 26 and inner ridge portions 28, 30, 32, 34. The outer ridge portions 24, 26 extend outward from the outer surface 22 of the handle portion 12 a greater distance than the inner ridge portions 28, 30, 32, 34. The plurality of ridge portions 18 provides a fixed location for a user to contact the handle portion 12 of the circuit board ejector 10. As a result, the plurality of ridge portions 18 allow a user to quickly and easily apply a load to the circuit board ejector 10 at the optimum location along the handle portion 12. The plurality of ridge portions 18 also prevent a user from applying the load to the handle portion 12 at a point that is closer to the hook portion 14 which may result in difficulties in rotating the handle portion 12. The plurality of ridge portions 18 also prevents a user's finger from slipping off the handle portion 12 during actuation of the circuit board ejector 10. In the embodiment shown, the plurality of ridge portions 18 each has an arcuate surface, although other configurations and shapes are contemplated.

The raised lip portion 20 may preferably be adjacent an end 36 of the handle portion 12. The raised lip portion 20 may preferably extend outward from the outer surface 22 of the handle portion 12 a greater distance than the plurality of ridge portions 18. The advantage of this arrangement is that the raised lip portion 20 prevents a user's finger from contacting the locking spring 42 during actuation of the circuit board ejector 10. This eliminates the chance of the user's finger being pinched between the handle portion 12 and the locking spring 42.

As shown in FIG. 2, the outer side 38 of the raised lip portion 20 may preferably define a recess 40 to receive a locking spring 42. This arrangement ensures that the handle portion 12 remains locked when the circuit board ejector 10 is in the locked position. In operation, a user may apply a load to the manually operable portion 16 of the handle portion 12 to position the circuit board ejector 10 into a locked position as shown in FIGS. 1–2. When in the locked position, the spring 42 is received in the recess 40 defined by the outer side 38 of the raised lip portion 20.

While the embodiments of the invention disclosed herein are presently considered to be preferred, various changes and modifications can be made without departing from the spirit and scope of the invention. The scope of the invention is indicated in the appended claims and all changes that come within the meaning and range of equivalents are intended to be embraced therein.

We claim:

1. A circuit board ejector comprising:

a handle portion and a hook portion, the handle portion including an end, a manually operable portion located adjacent to the end of the handle portion, the manually operable portion defined by a plurality of ridge portions and a raised lip portion adjacent to a spring receiving end of the handle portion, wherein the plurality of ridge portions and the raised lip portion extend outward from an outer surface of the handle portion and wherein the raised lip portion extends outward from the outer surface of the handle portion a greater distance than the plurality of ridge portions to allow a user to apply a load to the manually operable portion to position the circuit board ejector into a locked position.

2. The apparatus of claim 1 wherein the plurality of ridge portions each have an arcuate surface.

3. The apparatus of claim 1 wherein the plurality of ridge portions include outer ridge portions and inner ridge portions, the outer ridge portions extending outward from an outer surface of the handle portion a greater distance than the inner ridge portions to facilitate contact of a finger of the user with the manually operable portion.

4. The apparatus of claim 1 wherein an outer side of the raised lip portion defines a recess to receive a locking spring.

5. The apparatus of claim 1 wherein the handle portion is comprised of aluminum.

6. A circuit board ejector comprising:

a handle portion and a hook portion, the handle portion including a manually operable portion located adjacent an end of the handle portion, the manually operable portion defined by a plurality of integrally formed ridge portions and an integrally formed raised lip portion adjacent to a spring receiving end of the handle portion, wherein the outer side of the raised lip portion defines a recess to receive a locking spring, wherein the plurality of ridge portions and the raised lip portion extend outward from an outer surface of the handle portion, and wherein the raised lip portion extends outward from the outer surface of the handle portion a greater distance than the plurality of ridge portions to allow a user to apply a load to the manually operable portion to position the circuit board ejector into a locked position.

7. A method of operating a circuit board ejector comprising:

providing a handle portion and a hook portion, the handle portion including an end, a manually operable portion located adjacent to the end of the handle portion, the manually operable portion defined by a plurality of ridge portions and a raised lip portion adjacent to a spring receiving end of the handle portion, wherein the plurality of ridge portions and the raised lip portion extend outward from an outer surface of the handle portion and wherein the raised lip portion extends outward from the outer surface of the handle portion a greater distance than the plurality of ridge portions;

applying a load to the manually operable portion; and positioning the circuit board ejector into a locked position.

* * * * *